(12) United States Patent
Chen

(10) Patent No.: US 12,308,281 B2
(45) Date of Patent: May 20, 2025

(54) METHOD FOR MANUFACTURING ISOLATION STRUCTURE OF HYBRID EPITAXIAL AREA AND ACTIVE AREA IN FDSOI

(71) Applicant: Shanghai Huali Integrated Circuit Corporation, Shanghai (CN)

(72) Inventor: Yongyue Chen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 508 days.

(21) Appl. No.: 17/951,290

(22) Filed: Sep. 23, 2022

(65) Prior Publication Data

US 2023/0132891 A1 May 4, 2023

(30) Foreign Application Priority Data

Oct. 29, 2021 (CN) .......................... 202111268268.X

(51) Int. Cl.
*H01L 21/762* (2006.01)
*H01L 21/3065* (2006.01)
*H01L 21/311* (2006.01)

(52) U.S. Cl.
CPC ...... *H01L 21/7624* (2013.01); *H01L 21/3065* (2013.01); *H01L 21/31105* (2013.01)

(58) Field of Classification Search
CPC ............. H01L 21/7624; H01L 21/3065; H01L 21/31105; H01L 21/76283; H01L 21/76224; H01L 21/76264
See application file for complete search history.

(56) References Cited

U.S. PATENT DOCUMENTS

| | | | | |
|---|---|---|---|---|
| 2014/0167164 A1* | 6/2014 | Adam | ................ | H10D 30/6744 438/585 |
| 2016/0020138 A1* | 1/2016 | Chang | ............... | H01L 21/76264 257/508 |
| 2016/0254145 A1* | 9/2016 | Triyoso | ............. | H01L 21/02236 257/616 |
| 2018/0090386 A1* | 3/2018 | Faul | ...................... | H10D 84/038 |
| 2022/0310443 A1* | 9/2022 | Guan | ................ | H01L 21/76272 |
| 2022/0415707 A1* | 12/2022 | Chen | ...................... | H10D 87/00 |

* cited by examiner

*Primary Examiner* — Yasser A Abdelaziz
(74) *Attorney, Agent, or Firm* — Banner & Witcoff, Ltd.

(57) ABSTRACT

The present application discloses a method for manufacturing an isolation structure of a hybrid epitaxial area and an active area in an FDSOI, comprising: step 1, providing an FDSOI substrate structure and forming a hard mask layer; step 2, removing the hard mask layer and a semiconductor top layer in the hybrid epitaxial area, so as to form a top trench; step 3, performing lateral etching on the exposed semiconductor top layer from a side surface of the top trench to form a recess cavity; step 4, filling the recess cavity to form an inner spacer; step 5, performing an etching process to form a bottom trench having a bottom surface that exposes a semiconductor body layer; and step 6, performing epitaxial growth to form a semiconductor epitaxial layer in the trench that is in contact with the semiconductor body layer.

16 Claims, 5 Drawing Sheets

METHOD FOR MANUFACTURING ISOLATION STRUCTURE OF HYBRID EPITAXIAL AREA AND ACTIVE AREA IN FDSOI

CROSS-REFERENCE TO RELATED APPLICATIONS

This application claims the priority to Chinese patent application No. 202111268268.X, filed on Oct. 29, 2021, the disclosure of which is incorporated herein by reference in its entirety.

TECHNICAL FIELD

The present application relates to a method for manufacturing a semiconductor integrated circuit, in particular to a method for manufacturing an isolation structure of a hybrid epitaxial area and an active area (AA) in a fully depleted semiconductor on insulator (FDSOI).

BACKGROUND

FIG. 1 is a schematic diagram of a device structure obtained after an existing method for manufacturing an isolation structure of a hybrid epitaxial area and an active area in an FDSOI is completed and after a transistor is formed in the active area. The existing method for manufacturing an isolation structure of a hybrid epitaxial area and an active area in an FDSOI includes the following steps.

An FDSOI substrate structure is provided, the FDSOI substrate including a semiconductor body layer 101, a dielectric buried layer 102, and a semiconductor top layer 103, the buried dielectric layer 102 being formed on the surface of the semiconductor body layer 101, the semiconductor top layer 103 being formed on the surface of the buried dielectric layer 102; and a hard mask layer 301 is formed on the surface of the semiconductor top layer 103.

The hybrid epitaxial area is defined. In FIG. 1, an area indicated by braces 104 is the hybrid epitaxy area, and the active area is formed by the semiconductor top layer 103 in an area indicated by braces 105, that is, after the isolation structure is formed, the semiconductor top layer 103 in the area indicated by the braces 105 serves as the active area.

Etching is performed to completely remove the hard mask layer 301, the semiconductor top layer 103, and the buried dielectric layer 102 in the hybrid epitaxial area and to remove no or a part of the semiconductor body layer 101, so as to form a trench subsequently.

Epitaxial growth is performed to form a semiconductor epitaxial layer 107 in the trench that is in contact with the semiconductor body layer 101.

A shallow trench isolation 106 is formed by means of a shallow trench isolation process. The shallow trench isolation process includes a shallow trench etching process and filling a shallow trench formed by the etching with an oxide layer. The shallow trench isolation 106 is composed of the oxide layer filling the shallow trench.

In the area indicated by the braces 105, the semiconductor top layer 103 enclosed by the shallow trench isolation 106 serves as the active area.

After the shallow trench isolation 106 is formed, the manufacturing of a semiconductor device such as a transistor and a corresponding lead-out structure can be performed. The transistors are mainly CMOS devices, and the CMOS devices include PMOS and NMOS.

Generally, a passive device or an electrode lead-out structure that needs to be connected to the semiconductor body layer 101 is formed on the surface of the semiconductor epitaxial layer 107 in the hybrid area.

The CMOS device is formed in the semiconductor top layer 103 outside the hybrid area.

A transistor is shown in FIG. 1, and the transistor includes a gate structure 108, the gate structure 108 including a gate dielectric layer and a gate conductive material layer stacked in sequence. The gate dielectric layer is made of silicon dioxide or a high dielectric constant material. The gate conductive material layer is a polysilicon gate or metal gate.

A spacer 109 is formed on a side surface of the gate structure 108.

A first source-drain area 110a and a second source-drain area 110b are formed on two sides of the gate structure 108. In FIG. 1, the first source-drain area 110a and the second source-drain area 110b are formed in a raised epitaxial layer, and the raised epitaxial layer is formed on the surface of the semiconductor top layer 103.

In the semiconductor body layer 101 directly under the transistor, a well area, such as an N-type well or a P-type well, is usually formed and used as a back gate structure. The electrode lead-out structure formed in the adjacent hybrid epitaxial area 104 needs to provide a bias for the back gate structure. A path 111 is a path for applying the bias to the back gate structure of the transistor from the hybrid epitaxial area 104.

BRIEF SUMMARY

The present application is to provide a method for manufacturing an isolation structure of a hybrid epitaxial area and an active area in an FDSOI, so as to reduce the dimension of the isolation structure of the hybrid epitaxial area and the active area, increase transistor density, and enhance the capability of a back gate to regulate a threshold voltage.

According to some embodiments in this application, the method for manufacturing an isolation structure of a hybrid epitaxial area and an active area in an FDSOI provided by the present application includes the following steps:

step 1, providing an FDSOI substrate structure, the FDSOI substrate including a semiconductor body layer, a dielectric buried layer, and a semiconductor top layer, the buried dielectric layer being formed on the surface of the semiconductor body layer, the semiconductor top layer being formed on the surface of the buried dielectric layer; and forming a hard mask layer on the surface of the semiconductor top layer;

step 2, defining the hybrid epitaxial area, and performing first etching to remove the hard mask layer and the semiconductor top layer in the hybrid epitaxial area, so as to form a top trench in an area where the hard mask layer and the semiconductor top layer are removed;

step 3, performing lateral etching on the exposed semiconductor top layer from a side surface of the top trench to form a recess cavity;

step 4, filling the recess cavity with a first dielectric layer to form an inner spacer, the inner spacer serving as the isolation structure of the hybrid epitaxial area and the active area;

step 5, performing second etching by using the hard mask layer as a mask, the second etching completely removing the buried dielectric layer at the bottom of the top trench and removing no or a part of the semiconductor body layer, so as to form a bottom trench, wherein a bottom surface of the bottom trench exposes the semiconductor body layer, and the bottom trench and the top trench are stacked to form a trench; and step 6, performing epitaxial growth to form a semiconductor epitaxial layer in the trench that is in contact with the semiconductor body layer.

In some cases, the material of the semiconductor body layer includes silicon or germanium.

In some cases, the material of the dielectric buried layer includes silicon oxide, or a high dielectric constant material.

In some cases, the material of the semiconductor top layer includes silicon or germanium.

In some cases, the material of the semiconductor epitaxial layer includes silicon or germanium.

In some cases, the hard mask layer is formed by stacking a first silicon oxide layer and a second silicon nitride layer.

In some cases, in step 2, the hybrid area is defined by means of a lithography process, and the first etching is dry etching or wet etching.

In some cases, the thickness of the semiconductor top layer is less than 12 nm.

In some cases, in step 3, the lateral etching is performed on the semiconductor top layer by means of a dry etching process.

In some cases, in step 3, the lateral width of the recess cavity is 10 Å-20 Å.

In some cases, step 4 includes the following sub-steps:

step 41, depositing the first dielectric layer, the first dielectric layer covering both a bottom surface and a side surface of the top trench as well as the surface of the hard mask layer outside the top trench, the thickness of the first dielectric layer being required to completely fill the recess cavity; and step 42, fully etching the first dielectric layer to completely remove the first dielectric layer on the bottom surface of the top trench and on the surface of the hard mask layer outside the top trench and to completely remove the first dielectric layer on the side surface of the top trench outside the recess cavity, so that the first dielectric layer remaining in the recess cavity serves as the inner spacer.

In some cases, the first dielectric layer is made of a low-k material.

In some cases, the low-k material forming the first dielectric layer includes: FSG, SiOCF, or SiOC.

In some cases, in step 41, the first dielectric layer is formed by means of an atomic layer deposition (ALD) process.

In some cases, after the epitaxial growth is completed in step 6, a top surface of the semiconductor epitaxial layer is flush with a top surface of the semiconductor top layer.

In some cases, in step 6, the epitaxial growth of the semiconductor epitaxial layer is performed by means of a reduced pressure chemical vapor deposition (RPCVD) process.

In the present application, during an etching process for forming a growth area trench of the semiconductor epitaxial layer serving as the hybrid epitaxial area, the formation of the trench is divided into two times of etching. The first etching removes only the hard mask layer and a semiconductor top layer to form the top trench. In this case, since the semiconductor top layer on the side surface of the top trench is exposed, the recess cavity can be formed by performing the lateral etching on a side surface of the semiconductor top layer, and the inner spacer can be formed by filling the recess cavity with the first dielectric layer. Subsequently, the second etching is performed to form the bottom trench that exposes the surface of the semiconductor body layer, and then the trench formed by stacking the bottom trench and the top trench is filled with the semiconductor epitaxial layer. In this way, the filling semiconductor epitaxial layer is isolated from the semiconductor top layer outside the hybrid epitaxial area by the inner spacer, without subsequent manufacturing of an additional isolation structure, such as a shallow trench isolation structure. Compared with the shallow trench isolation structure, the inner spacer of the present application is formed in a self-aligned manner on the side surface of the semiconductor top layer exposed from the top trench, and therefore, the dimension thereof can be reduced, thereby increasing the transistor density.

In addition, the active area is usually used for forming a transistor, and the hybrid epitaxial area is used for forming a passive device or an electrode lead-out structure that needs to be connected to the semiconductor body layer. The semiconductor body layer directly under the transistor is usually used as a back gate structure. The electrode lead-out structure formed in the adjacent hybrid epitaxial area needs to provide a bias for the back gate structure. Since the dimension of the isolation structure of the present application is smaller, a path for applying the bias to the back gate structure of the transistor is shorter, thereby enhancing the capability of the back gate to regulate the threshold voltage.

BRIEF DESCRIPTION OF THE DRAWINGS

The present application is described in detail below with reference to the drawings and specific implementations.

DETAILED DESCRIPTION OF THE DISCLOSURE

Figure 2:
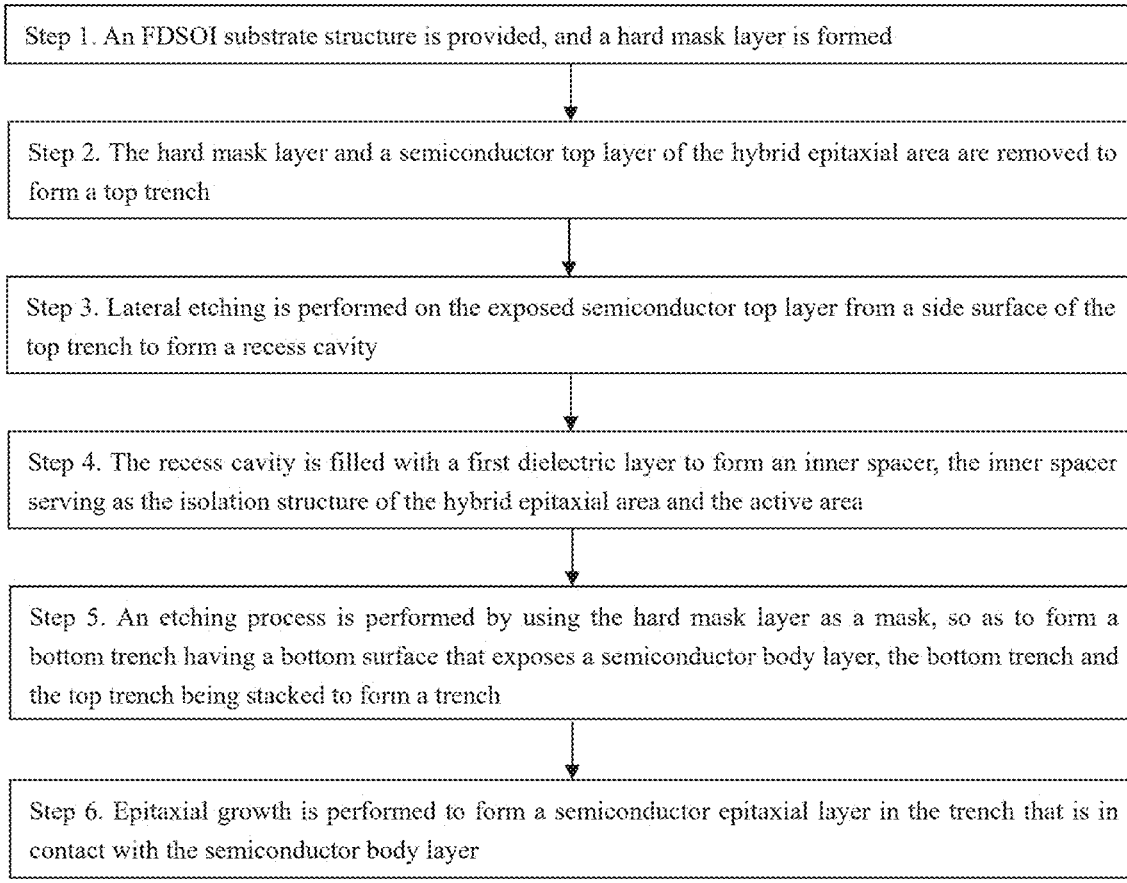
FIG. 2 is a flowchart of a method for manufacturing an isolation structure of a hybrid epitaxial area and an active area in an FDSOI according to an embodiment of the present application.

FIG. 2 is a flowchart of a method for manufacturing an isolation structure of a hybrid epitaxial area and an active area in an FDSOI according to an embodiment of the present application. FIGS. 3A-3I are schematic diagrams of device structures in steps of the method for manufacturing an isolation structure of a hybrid epitaxial area and an active area in an FDSOI according to an embodiment of the present application. The method for manufacturing an isolation structure of a hybrid epitaxial area and an active area in an FDSOI according to this embodiment of the present application includes the following steps.

Figure 3A:
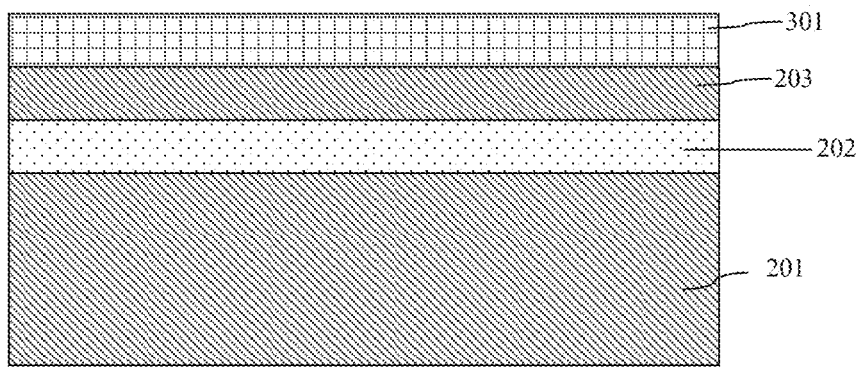
FIGS. 3A-3I are schematic diagrams of device structures in steps of the method for manufacturing an isolation structure of a hybrid epitaxial area and an active area in an FDSOI according to an embodiment of the present application.

Step 1. Referring to FIG. 3A, an FDSOI substrate structure is provided, the FDSOI substrate including a semiconductor body layer 201, a dielectric buried layer 202, and a semiconductor top layer 203, the buried dielectric layer 202 being formed on the surface of the semiconductor body layer 201, the semiconductor top layer 203 being formed on the surface of the buried dielectric layer 203; and a hard mask layer 301 is formed on the surface of the semiconductor top layer 203.

In this embodiment of the present application, the material of the semiconductor body layer 201 includes silicon or germanium.

The material of the dielectric buried layer 202 includes silicon oxide, or a high dielectric constant material.

The material of the semiconductor top layer 203 includes silicon or germanium. The thickness of the semiconductor top layer is less than 12 nm. The hard mask layer 301 is formed by stacking a first silicon oxide layer and a second silicon nitride layer.

Figure 3B:
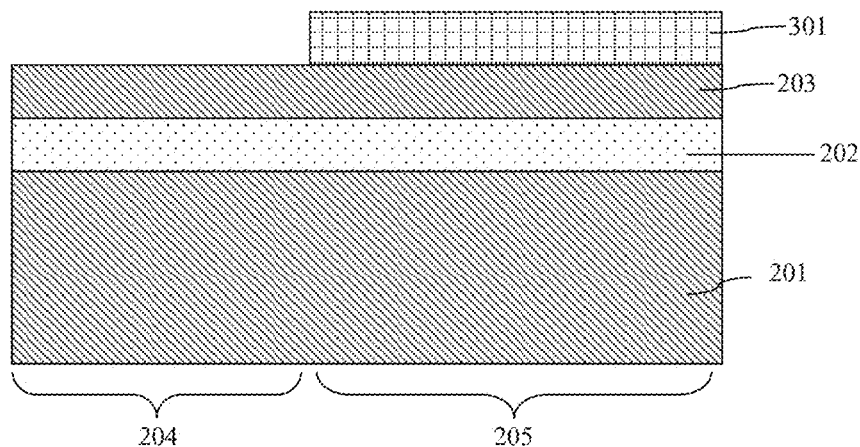

Step 2. Referring to FIG. 3B, the hybrid epitaxial area is defined.

In this embodiment of the present application, the hybrid area is defined by means of a lithography process. In FIG. 3B, an area indicated by braces 204 is the hybrid epitaxy area, and the active area is formed by the semiconductor top layer 203 in an area indicated by braces 205, that is, after the isolation structure is formed, the semiconductor top layer 203 in the area indicated by the braces 205 serves as the active area.

First etching is performed to remove the hard mask layer 301 and the semiconductor top layer 203 in the hybrid epitaxial area, so as to form a top trench 302 in an area where the hard mask layer 301 and the semiconductor top layer 203 are removed.

Referring to FIG. 3B, the first etching removes the hard mask layer 301 firstly, in which case the hard mask layer 301 is etched by using a photoresist pattern formed by a lithography process as a mask.

Figure 3C:
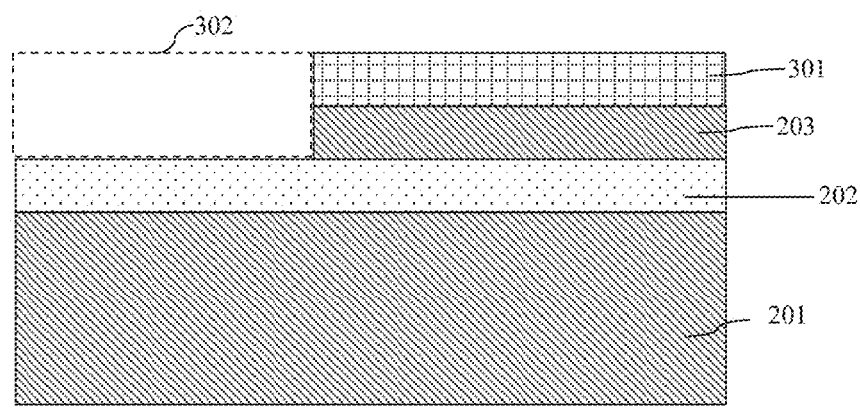

Then, referring to FIG. 3C, the first etching continues to etch the semiconductor top layer 203 and forms the top trench 302.

Figure 3D:
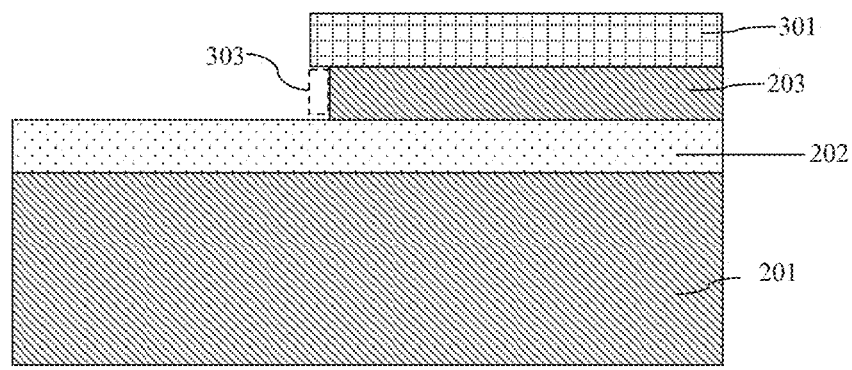

Step 3. Referring to FIG. 3D, lateral etching is performed on the exposed semiconductor top layer 203 from a side surface of the top trench 302 to form a recess cavity 303.

In this embodiment of the present application, the lateral etching is performed on the semiconductor top layer 203 by means of a dry etching process.

The lateral width of the recess cavity 303 is 10 Å-20 Å.

Step 4. The recess cavity 303 is filled with a first dielectric layer 206a to form an inner spacer 206, the inner spacer 206 serving as the isolation structure of the hybrid epitaxial area and the active area.

In this embodiment of the present application, step 4 includes the following sub-steps.

Figure 3E:
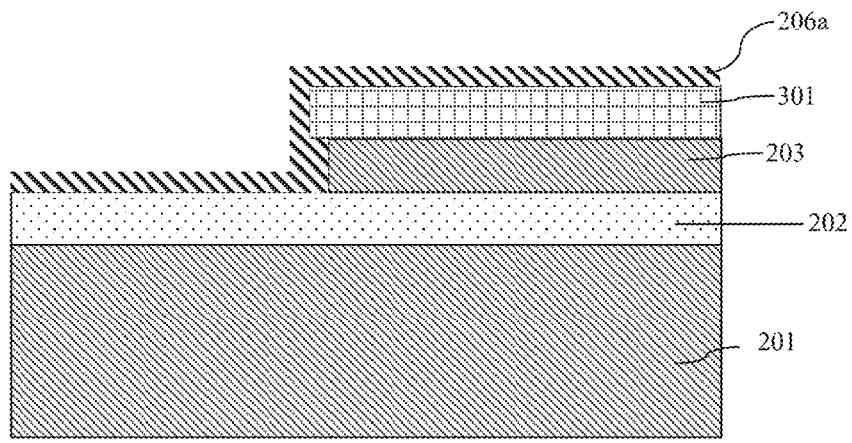

Step 41. Referring to FIG. 3E, the first dielectric layer 206a is deposited, the first dielectric layer 206a covering both a bottom surface and a side surface of the top trench 302 as well as the surface of the hard mask layer 301 outside the top trench 302, the thickness of the first dielectric layer 206a being required to completely fill the recess cavity 303.

In some examples, the first dielectric layer 206a is made of a low-k material. The low-k material forming the first dielectric layer 206a includes: FSG, SiOCF, or SiOC. The use of the low-k material can reduce coupling between functional areas, so that when an interval between the functional areas is reduced, there is no adverse impact on each functional area, thereby further reducing the dimension of the isolation structure of the hybrid epitaxial rea and the active area.

The first dielectric layer 206a is formed by means of an atomic layer deposition process.

Figure 3F:
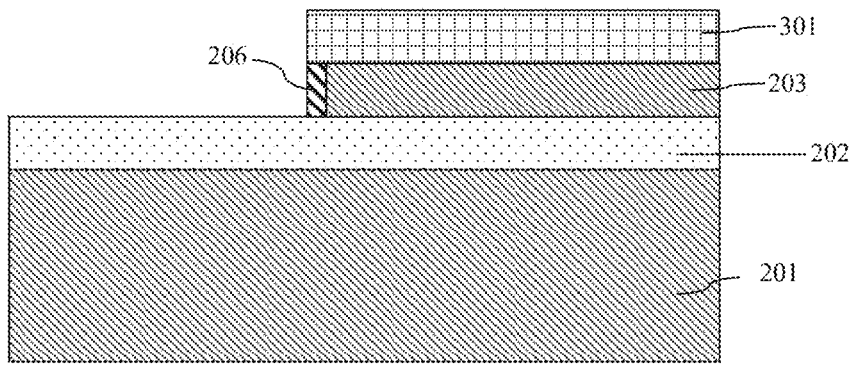

Step 42. Referring to FIG. 3F, the first dielectric layer 206a is fully etched to completely remove the first dielectric layer 206a on the bottom surface of the top trench 302 and on the surface of the hard mask layer 301 outside the top trench 302 and to completely remove the first dielectric layer 206a on the side surface of the top trench 302 outside the recess cavity 303, so that the first dielectric layer 206a remaining in the recess cavity 303 serves as the inner spacer 206.

Figure 3G:
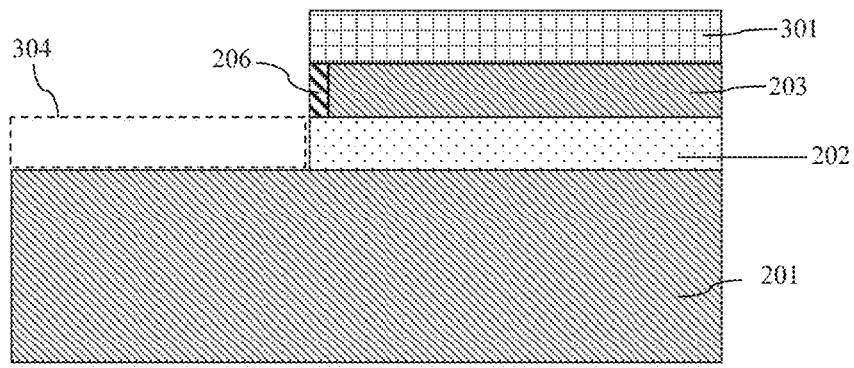

Step 5. Referring to FIG. 3G, second etching is performed by using the hard mask layer 301 as a mask, the second etching completely removing the buried dielectric layer 202 at the bottom of the top trench 302 and removing no or a part of the semiconductor body layer 201, so as to form a bottom trench 304, wherein a bottom surface of the bottom trench 304 exposes the semiconductor body layer 201, and the bottom trench 304 and the top trench 302 are stacked to form a trench.

Figure 3H:
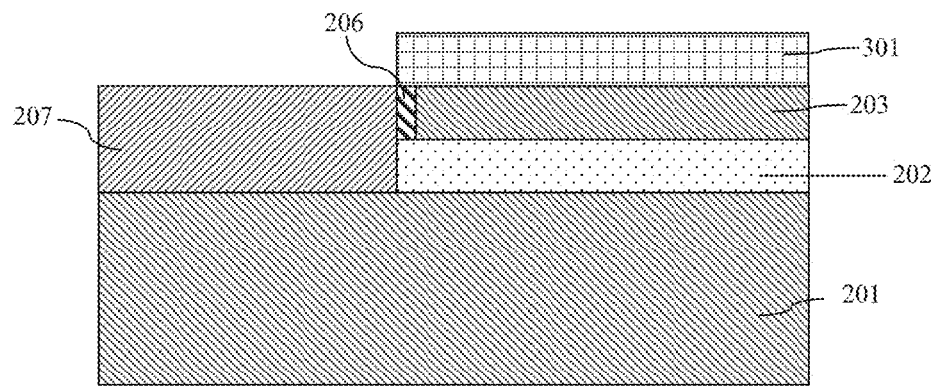

Step 6. Referring to FIG. 3H, epitaxial growth is performed to form a semiconductor epitaxial layer 207 in the trench that is in contact with the semiconductor body layer 201.

In this embodiment of the present application, after the epitaxial growth is completed, a top surface of the semiconductor epitaxial layer 207 is flush with a top surface of the semiconductor top layer 203.

The material of the semiconductor epitaxial layer 207 includes silicon or germanium.

The epitaxial growth of the semiconductor epitaxial layer 207 is performed by means of an RPCVD process.

Figure 3I:
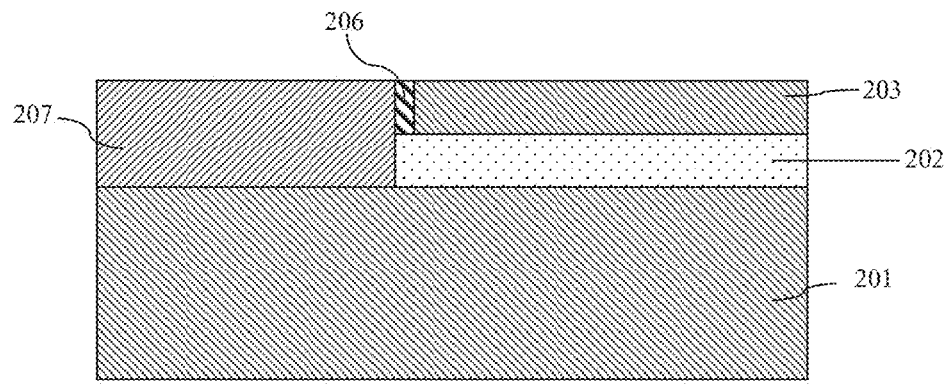

Referring to FIG. 3I, the hard mask layer 301 is removed subsequently.

On the basis of the structure shown in FIG. 3I, a semiconductor device such as a transistor and a corresponding lead-out structure can be manufactured. The transistors are mainly CMOS devices, and CMOS devices include PMOS and NMOS.

Generally, a passive device or an electrode lead-out structure that needs to be connected to the semiconductor body layer 201 is formed on the surface of the semiconductor epitaxial layer 207 in the hybrid area.

The CMOS device is formed in the semiconductor top layer 203 outside the hybrid area.

Figure 4:
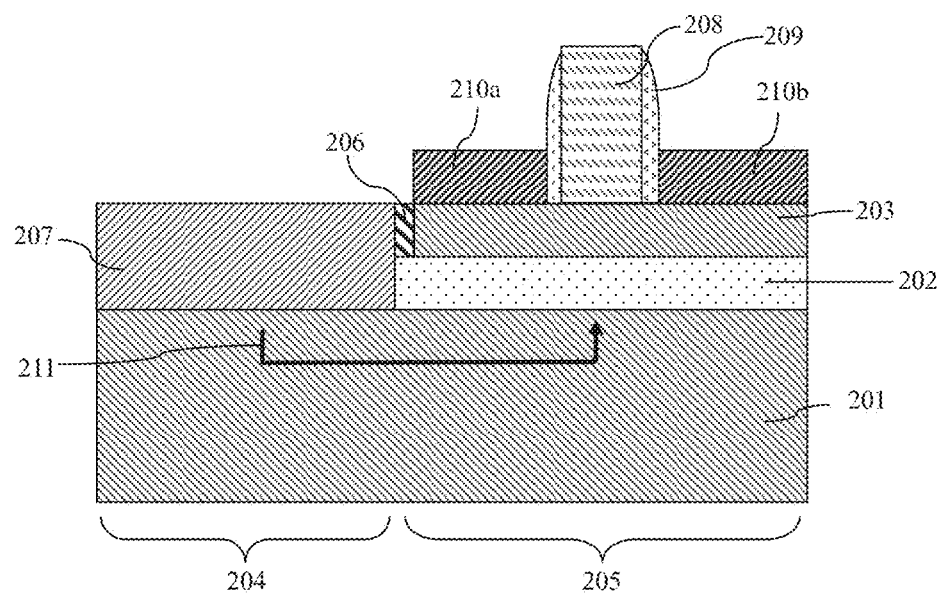
FIG. 4 is a schematic diagram of a device structure obtained after the method for manufacturing an isolation structure of a hybrid epitaxial area and an active area in an FDSOI is completed and after a transistor is formed in the active area according to an embodiment of the present application.

FIG. 4 is a schematic diagram of a device structure obtained after the method for manufacturing an isolation structure of a hybrid epitaxial area and an active area in an FDSOI is completed and after a transistor is formed in the active area according to an embodiment of the present application. A transistor is shown in FIG. 4, and the transistor includes a gate structure 208, the gate structure 208 including a gate dielectric layer and a gate conductive material layer stacked in sequence. The gate dielectric layer is made of silicon dioxide or a high dielectric constant material. The gate conductive material layer is a polysilicon gate or metal gate.

A spacer 209 is formed on a side surface of the gate structure 208.

A first source-drain area 210a and a second source-drain area 210b are formed on two sides of the gate structure 208. In FIG. 4, the first source-drain area 210a and the second source-drain area 20b are formed in a raised epitaxial layer, and the raised epitaxial layer is formed on the surface of the semiconductor top layer 203.

Figure 1:
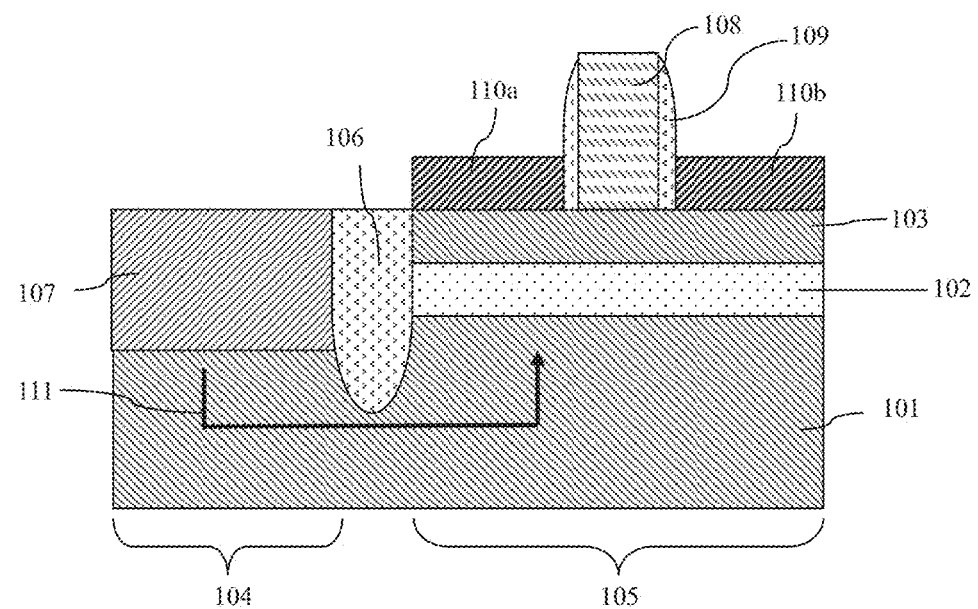
FIG. 1 is a schematic diagram of a device structure obtained after an existing method for manufacturing an isolation structure of a hybrid epitaxial area and an active area in an FDSOI is completed and after a transistor is formed in the active area.

In the semiconductor body layer 201 directly under the transistor, a well area, such as an N-type well or a P-type well, is usually formed and used as a back gate structure. The electrode lead-out structure formed in the adjacent hybrid epitaxial area 204 needs to provide a bias for the back gate structure. Since the dimension of the isolation structure of this embodiment of the present application is smaller, a path 211 for applying the bias to the back gate structure of the transistor is shorter, i.e., shorter than a path 111 in FIG. 1, thereby enhancing the capability of the back gate to regulate a threshold voltage.

In this embodiment of the present application, during an etching process for forming a growth area trench of the semiconductor epitaxial layer 207 serving as the hybrid epitaxial area, the formation of the trench is divided into two times of etching. The first etching removes only the hard mask layer 301 and a semiconductor top layer 203 to form the top trench 302. In this case, since the semiconductor top layer 203 on the side surface of the top trench 302 is exposed, the recess cavity 303 can be formed by performing the lateral etching on a side surface of the semiconductor top layer 203, and the inner spacer 206 can be formed by filling the recess cavity 303 with the first dielectric layer 206a. Subsequently, the second etching is performed to form the bottom trench 304 that exposes the surface of the semiconductor body layer 201, and then the trench formed by stacking the bottom trench 304 and the top trench 302 is filled with the semiconductor epitaxial layer 207. In this way, the filling semiconductor epitaxial layer 207 is isolated from the semiconductor top layer 203 outside the hybrid epitaxial area by the inner spacer 206, without subsequent manufacturing of an additional isolation structure, such as a shallow trench isolation structure. Compared with the shallow trench isolation structure, the inner spacer 206 of the present application is formed in a self-aligned manner on the side surface of the semiconductor top layer 203 exposed from the top trench 302, and therefore, the dimension thereof can be reduced, thereby increasing the transistor density.

The present application is described in detail above by using specific embodiments, which, however, are not intended to limit the present application. Without departing from the principles of the present application, those skilled in the art can also make many modifications and improvements, which should also be regarded as the scope of protection of the present application.

What is claimed is:

1. A method for manufacturing an isolation structure of a hybrid epitaxial area and an active area in a fully depleted semiconductor on insulator (FDSOI), comprising:
   step 1, providing an FDSOI substrate structure, the FDSOI substrate structure comprising a semiconductor body layer, a dielectric buried layer, and a semiconductor top layer, the buried dielectric layer being formed on a surface of the semiconductor body layer, the semiconductor top layer being formed on a surface of the buried dielectric layer; and forming a hard mask layer on the surface of the semiconductor top layer;
   step 2, defining the hybrid epitaxial area, and performing first etching to remove the hard mask layer and the semiconductor top layer in the hybrid epitaxial area, so as to form a top trench in an area where the hard mask layer and the semiconductor top layer are removed;
   step 3, performing lateral etching on the exposed semiconductor top layer from a side surface of the top trench to form a recess cavity;
   step 4, filling the recess cavity with a first dielectric layer to form an inner spacer, the inner spacer serving as the isolation structure of the hybrid epitaxial area and the active area;
   step 5, performing second etching by using the hard mask layer as a mask, the second etching completely removing the buried dielectric layer at a bottom of the top trench and removing no or a part of the semiconductor body layer, so as to form a bottom trench, wherein a bottom surface of the bottom trench exposes the semiconductor body layer, and the bottom trench and the top trench are stacked to form a trench; and
   step 6, performing epitaxial growth to form a semiconductor epitaxial layer in the trench that is in contact with the semiconductor body layer.

2. The method for manufacturing the isolation structure of the hybrid epitaxial area and the active area in the FDSOI according to claim 1, wherein a material of the semiconductor body layer comprises silicon or germanium.

3. The method for manufacturing the isolation structure of the hybrid epitaxial area and the active area in the FDSOI according to claim 1, wherein a material of the dielectric buried layer comprises silicon oxide, or a high dielectric constant material.

4. The method for manufacturing the isolation structure of the hybrid epitaxial area and the active area in the FDSOI according to claim 1, wherein a material of the semiconductor top layer comprises silicon or germanium.

5. The method for manufacturing the isolation structure of the hybrid epitaxial area and the active area in the FDSOI according to claim 2, wherein a material of the semiconductor epitaxial layer comprises silicon or germanium.

6. The method for manufacturing the isolation structure of the hybrid epitaxial area and the active area in the FDSOI according to claim 1, wherein the hard mask layer is formed by stacking a first silicon oxide layer and a second silicon nitride layer.

7. The method for manufacturing the isolation structure of the hybrid epitaxial area and the active area in the FDSOI according to claim 1, wherein, in step 2, the hybrid epitaxial area is defined by means of a lithography process, and the first etching is dry etching or wet etching.

8. The method for manufacturing the isolation structure of the hybrid epitaxial area and the active area in the FDSOI according to claim 1, wherein a thickness of the semiconductor top layer is less than 12 nm.

9. The method for manufacturing the isolation structure of the hybrid epitaxial area and the active area in the FDSOI according to claim 1, wherein, in step 3, the lateral etching is performed on the semiconductor top layer by means of a dry etching process.

10. The method for manufacturing the isolation structure of the hybrid epitaxial area and the active area in the FDSOI according to claim 9, wherein, in step 3, a lateral width of the recess cavity is 10 Å-20 Å.

11. The method for manufacturing the isolation structure of the hybrid epitaxial area and the active area in the FDSOI according to claim 1, wherein step 4 comprises the following sub-steps:
   step 41, depositing the first dielectric layer, the first dielectric layer covering both a bottom surface and a side surface of the top trench as well as the surface of the hard mask layer outside the top trench, a thickness of the first dielectric layer being required to completely fill the recess cavity; and step 42, fully etching the first dielectric layer to completely remove the first dielectric layer on the bottom surface of the top trench and on the surface of the hard mask layer outside the top trench and to completely remove the first dielectric layer on the side surface of the top trench outside the recess cavity, so that the first dielectric layer remaining in the recess cavity serves as the inner spacer.

12. The method for manufacturing the isolation structure of the hybrid epitaxial area and the active area in the FDSOI according to claim 11, wherein the first dielectric layer is made of a low-k material.

13. The method for manufacturing the isolation structure of the hybrid epitaxial area and the active area in the FDSOI according to claim 12, wherein the low-k material forming the first dielectric layer comprises: FSG, SiOCF, or SiOC.

14. The method for manufacturing the isolation structure of the hybrid epitaxial area and the active area in the FDSOI according to claim 11, wherein, in step 41, the first dielectric layer is formed by means of an atomic layer deposition process.

15. The method for manufacturing the isolation structure of the hybrid epitaxial area and the active area in the FDSOI according to claim 1, wherein after the epitaxial growth is completed in step 6, a top surface of the semiconductor epitaxial layer is flush with a top surface of the semiconductor top layer.

16. The method for manufacturing the isolation structure of the hybrid epitaxial area and the active area in the FDSOI according to claim 1, wherein, in step 6, the epitaxial growth of the semiconductor epitaxial layer is performed by means of a reduced pressure chemical vapor deposition (RPCVD) process.

* * * * *